United States Patent
Lee et al.

(10) Patent No.: US 8,304,279 B2
(45) Date of Patent: Nov. 6, 2012

(54) LIGHT EMITTING DIODE PACKAGE HAVING ANODIZED INSULATION LAYER AND FABRICATION METHOD THEREFOR

(75) Inventors: Young Ki Lee, Seoul (KR); Seog Moon Choi, Seoul (KR); Sang Hyun Shin, Gyunggi-Do (KR)

(73) Assignee: Samsung Electronics Co., Ltd., Seoul (KR)

( * ) Notice: Subject to any disclaimer, the term of this patent is extended or adjusted under 35 U.S.C. 154(b) by 0 days.

(21) Appl. No.: 13/220,258

(22) Filed: Aug. 29, 2011

(65) Prior Publication Data
US 2011/0312109 A1    Dec. 22, 2011

Related U.S. Application Data

(62) Division of application No. 11/730,966, filed on Apr. 5, 2007, now Pat. No. 8,030,762.

(30) Foreign Application Priority Data

Apr. 5, 2006 (KR) .......................... 10-2006-0031093

(51) Int. Cl.
*H01L 21/00* (2006.01)
(52) U.S. Cl. .................. 438/69; 438/64; 257/E23.101
(58) Field of Classification Search ................ 438/64, 438/69; 257/E23.101
See application file for complete search history.

(56) References Cited

U.S. PATENT DOCUMENTS

| | | | |
|---|---|---|---|
| 5,912,477 A * | 6/1999 | Negley | 257/95 |
| 6,204,523 B1 | 3/2001 | Carey et al. | |
| 6,480,389 B1 * | 11/2002 | Shie et al. | 361/707 |
| 6,590,235 B2 | 7/2003 | Carey et al. | |
| 6,909,123 B2 | 6/2005 | Hayashimoto et al. | |
| 7,038,195 B2 | 5/2006 | Kida et al. | |
| 2003/0141506 A1 | 7/2003 | Sano et al. | |
| 2005/0035366 A1 | 2/2005 | Imai | |
| 2005/0051789 A1 * | 3/2005 | Negley et al. | 257/99 |
| 2006/0124953 A1 | 6/2006 | Negley et al. | |

FOREIGN PATENT DOCUMENTS

| | | |
|---|---|---|
| CN | 1581527 A | 2/2005 |
| CN | 1684278 A | 10/2005 |
| JP | 03-011771 | 1/1991 |
| JP | 2000-150968 | 5/2000 |

(Continued)

OTHER PUBLICATIONS

Japanese Office Action, w/ English translation thereof, issued in Japanese Patent Application No. JP 2007-097039 dated Sep. 14, 2010

(Continued)

*Primary Examiner* — Jenny L Wagner
(74) *Attorney, Agent, or Firm* — McDermott Will & Emery LLP (57) ABSTRACT

An LED package having an anodized insulation layer which increases heat radiation effect to prolong the lifetime LEDs and maintains high luminance and high output, and a method therefor. The LED package includes an Al substrate having a reflecting region and a light source mounted on the substrate and connected to patterned electrodes. The package also includes an anodized insulation layer formed between the patterned electrodes and the substrate and a lens covering over the light source of the substrate. The Al substrate provides superior heat radiation effect of the LED, thereby significantly increasing the lifetime and light emission efficiency of the LED.

9 Claims, 9 Drawing Sheets

FOREIGN PATENT DOCUMENTS

| | | |
|---|---|---|
| JP | 2004-111906 | 4/2004 |
| JP | 2004-221598 | 8/2004 |
| JP | 2004-228170 | 8/2004 |
| JP | 2005-175048 | 6/2005 |
| JP | 2006-012868 | 1/2006 |
| JP | 2006-049442 | 2/2006 |
| JP | 2006-060034 | 3/2006 |
| JP | 2006-060070 | 3/2006 |
| JP | 2007-505493 | 3/2007 |
| KR | 10-2004-0073434 | 8/2004 |
| KR | 10-2005-0031143 | 4/2005 |
| WO | WO 2005/027233 A2 | 3/2005 |

OTHER PUBLICATIONS

Taiwanese Office Action, with English Translation, issued in Taiwanese Patent Application No. 096111189, dated Jan. 19, 2011.
Chinese Office Action issued in Chinese Patent Application No. 200710092260.6, dated Jul. 17, 2009.
Korean Office Action, with English translation, issued in Korean Patent Application No. KR 10-2006-0031093, mailed May 21, 2007.
Chinese Office Action issued in Chinese Patent Application No. CN 2007100922606 dated Mar. 20, 2009.
Japanese Office Action, with English translation, issued in Japanese Patent Application No. 2007-097039, mailed Jan. 25, 2011.

* cited by examiner

Prior art

FIG. 10

LIGHT EMITTING DIODE PACKAGE HAVING ANODIZED INSULATION LAYER AND FABRICATION METHOD THEREFOR

RELATED APPLICATIONS

This application is a Divisional of U.S. application Ser. No. 11/730,966, filed on Apr. 5, 2007 now U.S. Pat. No. 8,030,762, which claims the benefit of Korean Patent Application No. 2006-0031093 filed on Apr. 5, 2006, in the Korean Intellectual Property Office, the entire contents of each of which are hereby incorporated by reference.

BACKGROUND OF THE INVENTION

1. Field of the Invention

The present invention relates to a Light Emitting Diode (LED) package of high luminance and high output, which uses an LED as a light source and a method therefor. More particularly, the present invention relates to an LED package, which has a light source mounted in a reflecting region of an aluminum (Al) substrate that is anodized to have an insulation layer, thereby increasing the heat radiation effect of the LED during the light emission operation, prolonging the lifetime of the LED and maintaining high luminance and output of the LED, and to a fabrication method therefor.

2. Description of the Related Art

Figure 1:
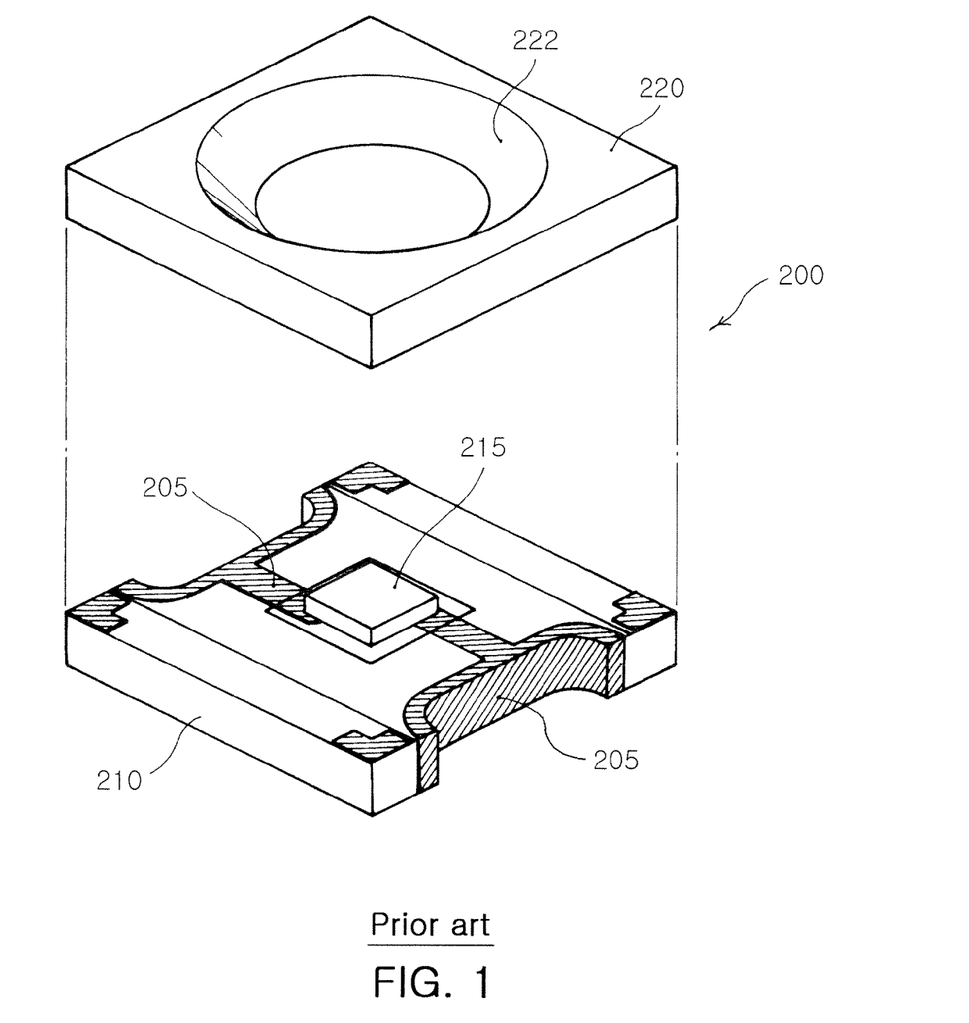
FIG. 1 is an exploded perspective view illustrating an LED package according to the prior art.

In general, as shown in FIG. 1, a conventional LED package having an LED as a light source includes an LED 215 mounted on a substrate 210 and electrically connected to power to operate and emit light.

In such an LED package 200, the LED 215 generates light according to its characteristics and radiates heat at the same time. Thus, it is critical that the heat is discharged effectively to the outside to prevent overheating in order to maintain a long lifetime and good output efficiency.

The conventional LED package 200 includes an LED 215 mounted on a circuit substrate 210 having a fixed patterned electrode 205, and also includes a reflecting member 220 having a roughly the same size as the exterior of the substrate 210 and a reflecting surface 222 formed therein. The reflecting member 220 is integrally fixed to the upper part of the substrate 210 by an epoxy resin, etc.

In such a conventional LED package 200, a concave reflecting surface 222 is formed in the reflecting member 220, and thus the light from the LED 215 is reflected forward by the reflecting surface 222.

However, in the conventional LED package 200, the substrate 210 is not made of a material with high heat conductivity, i.e., good heat radiation capacity, for example, aluminum (Al), and thus heat radiation is not effective during the light emission operation of the LED 215.

In addition, the conventional LED package 200 needs to have the reflecting member 220 fixed by a separate process, hindering a simplified manufacturing processes. Furthermore, the rather inaccurate process of integrating the reflecting member 220 with the substrate can be a major cause of defective products, thereby increasing the assembly costs.

SUMMARY OF THE INVENTION

The present invention has been made to solve the foregoing problems of the prior art and therefore an aspect of the present invention is to provide an LED package having an anodized insulation layer, which has a superior heat radiation effect of an LED through a substrate, thereby increasing the lifetime and light emission efficiency of the LED, and a fabrication method therefor.

Another aspect of the invention is to provide an LED package which does not require a separate bonding process of a reflecting member to a substrate and facilitates the process of aligning a lens to the substrate, thereby reducing the manufacturing costs through a simplified manufacturing process, and a fabrication method therefor.

According to an aspect of the invention, the invention provides an LED package which includes: an Al substrate having a reflecting region; a light source mounted on the substrate and electrically connected to patterned electrodes of the substrate, the light source comprising an LED; an anodized insulation layer formed between the patterned electrodes and the substrate; a lens disposed over the light source of the substrate; and an Al heat radiator formed under the LED so as to enhance heat radiation capacity.

Preferably, the substrate has the light source disposed in the reflecting region thereof, the LED of the light source comprising blue, red and green LEDs to emit white light.

Preferably, the substrate has electrode connecting grooves adjacent to the reflecting region thereof, the electrode connecting grooves electrically connecting the light source to patterned electrodes with wires.

Preferably, the substrate has lens assembly grooves formed adjacent to the reflecting region thereof, the lens assembly grooves defining the location of the lens part, and wherein the lens has projections formed on outer surfaces thereof which are assembled into the lens assembly grooves.

Preferably, the anodized insulation layer is formed in the electrode connecting grooves.

According to another aspect of the invention, the invention provides a method for fabricating a light emitting diode package. The method includes: etching a surface of a substrate to form a reflecting region; anodizing the substrate to form an insulation layer; forming patterned electrodes on the substrate; mounting a light source on the substrate and electrically connecting the light source to the patterned electrodes; and assembling a lens onto the substrate.

Preferably, the step of etching a surface of a substrate includes forming electrode connecting grooves adjacent to the reflecting region of the substrate to electrically connect the light source to the patterned electrodes with wires, and forming lens assembly grooves for defining the location of the lens part on the substrate.

Preferably, the method further includes dicing a mother substrate into a plurality of the individual substrate.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 2:
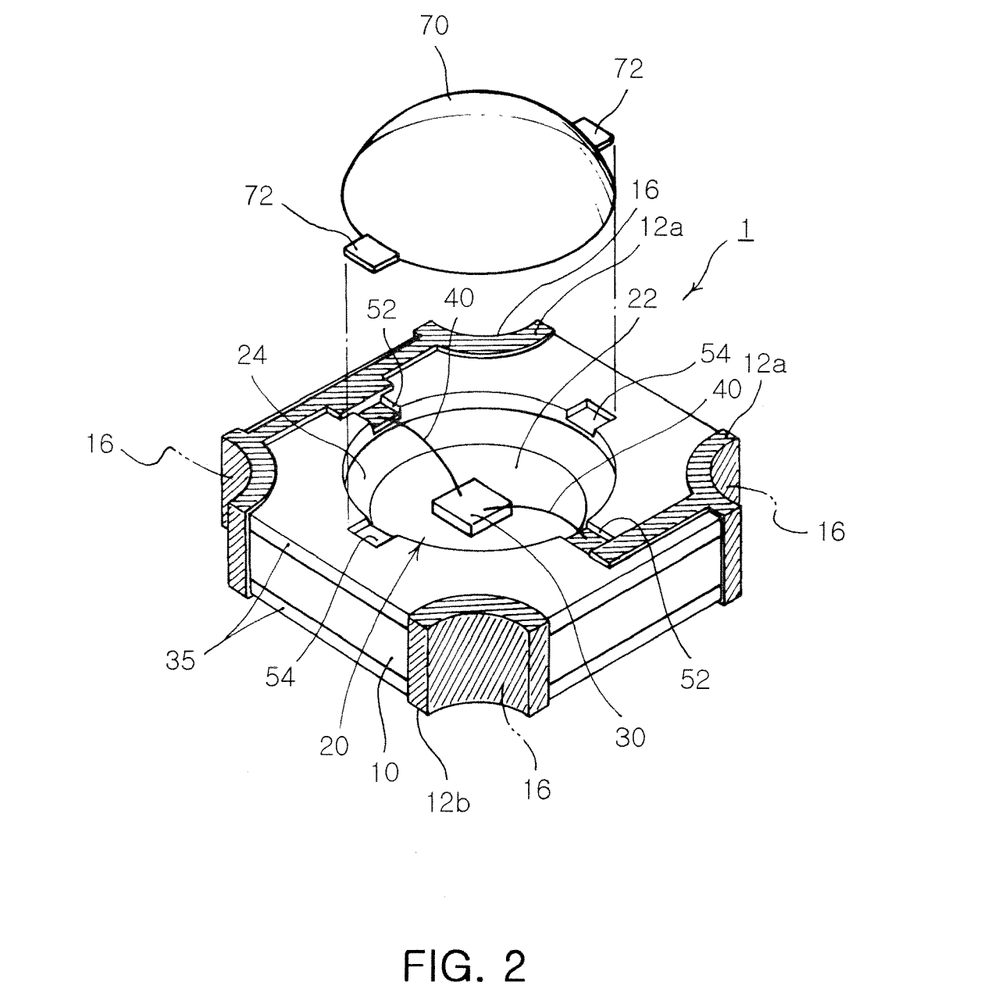
FIG. 2 is an exploded perspective view illustrating an LED package having an anodized insulation layer according to the present invention.

As shown in FIG. 2, an LED package 1 having an anodized insulation layer includes a substrate 10 made of an Al material. The substrate 10 is made of an Al material which is relatively low cost and easily manufactured.

Figure 3:
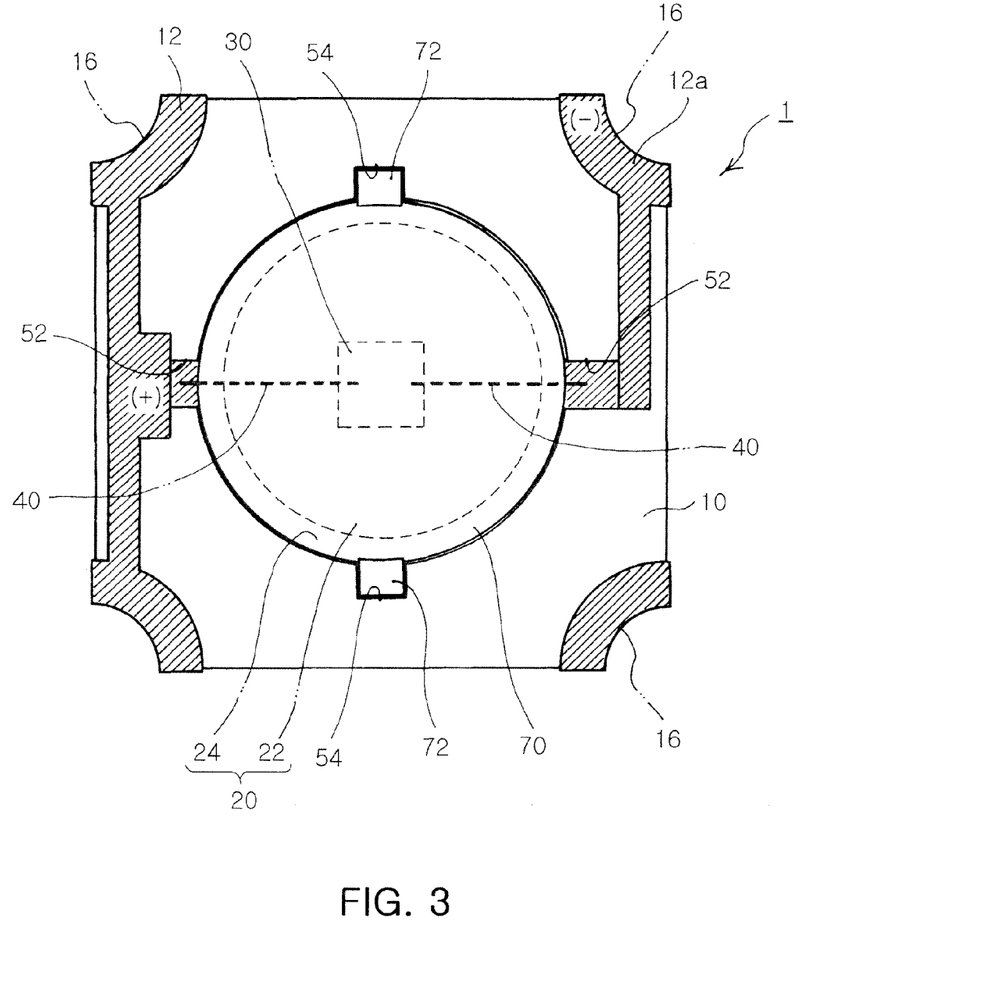
FIG. 3 is a plan view illustrating the LED package having an anodized insulation layer according to the present invention.

The substrate 10 has a reflecting region 20 formed in a center thereof. The reflecting region 20 is a recessed groove formed by etching. As shown in FIG. 3, the reflecting region 20 is composed of a planar central reflecting area 22 where the light source 30 is mounted as described later, i.e., a die bonding reflecting area and an inclined reflecting area 24, i.e., a reflecting surface surrounding the central reflecting area 22.

In addition, electrode connecting grooves 52 connecting the electrodes of the LEDs of the light source 30 with wires 40 and lens assembly grooves 54 defining the location of the lens 70 described later are formed adjacent to the inclined reflecting area 24 of the reflecting region 20 of the substrate 10.

The electrode connecting grooves 52 and the lens assembly grooves 54 are formed in shapes recessed from the surface of the substrate 10 but do not have a depth as large as the inclined reflecting area 24 of the reflecting region 20. Preferably, the electrode connecting grooves 52 have a depth somewhat larger than that of the lens assembly grooves 54. This structure facilitates the placement of the wires 40 in the electrode connecting grooves 52.

Moreover, the electrode connecting grooves 52 and the lens assembly grooves 54 are not limited in the number in which they are provided.

There can be provided one or two electrode connecting grooves 52 depending on the type of LED constituting the light source 30, and also, there can be provided a plurality of electrode connecting grooves 52 corresponding to the number of LEDs mounted on the substrate 10.

In addition, the lens assembly groove 54 can be any reference grooves for easily assembling the lens 70, and is not limited in the number provided.

In addition, patterned electrodes 12a and 12b are formed on the substrate 10 to supply power to the light source 30. The patterned electrodes 12a and 12b are formed on a location on an upper surface of the substrate 10 adjacent to the reflecting region 20 and on an opposed location on a lower surface of the substrate 10, respectively. The patterned electrodes 12a formed on an upper surface of the substrate 10 are for electric connection of the LED constituting the light source 30, whereas the patterned electrodes 12b formed on a lower surface of the substrate 10 serve as an electric connection pad of the LED package mounted on a surface of another substrate (not shown) as a Surface Mounted Device (SMD).

In addition, the patterned electrodes 12a and 12b are electrically connected to each other through a plurality of vias 16 penetrating the substrate 10.

The LED package 1 having an anodized insulation layer according to the present invention includes the light source 30 mounted on the substrate 10 with an LED electrically connected to the patterned electrodes 12a and 12b, and anodized insulation layers 35 formed between the patterned electrodes 12a and the substrate 10 and between the patterned electrodes 12b and the substrate 10.

The anodized insulation layer 35 is for insulating the patterned electrodes 12a and 12b from the substrate 10, and is formed by locally or partially treating the substrate with $Al_2O_3$ through anodizing or anodic-oxidization.

Such an anodized insulation layer 35 has somewhat low heat conductivity but has an excellent insulation capacity. It is formed between the patterned electrodes 12a and 12b and the substrate 10 to supply the power necessary for light emission operation of the light source 30.

In the meantime, such an anodized insulation layer 35 is formed in the electrode connecting grooves 52 to be electrically insulated from the substrate 10, but is not formed in the reflecting region 20 of the substrate 10 so as not to hinder the reflection of the light from the light source 30 to the outside.

Figure 4:
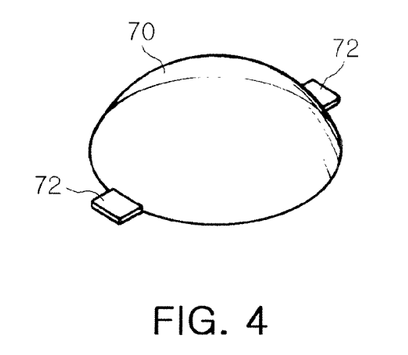
FIG. 4 is a perspective view of the exterior of a lens provided in the LED package having an anodized insulation layer according to the present invention.

In addition, the LED package 1 having an anodized insulation layer 35 includes a lens 70 covering over the light source 30 of the substrate 10. The lens 70 has a sectional shape with an upper hemispheric shape. As shown in FIG. 4, the lens 70 has projections 72 formed on outer surfaces thereof, which can be inserted into the lens assembly grooves 54.

These projections 72 correspond to the lens assembly grooves 54. Such projections 72 and the lens assembly grooves 54 allow an operator to easily find the mounting location or a referential location on the substrate 10 for attaching the lens 70. The lens 70 is adhered to the substrate 10 by a transparent adhesive resin.

Figure 5:
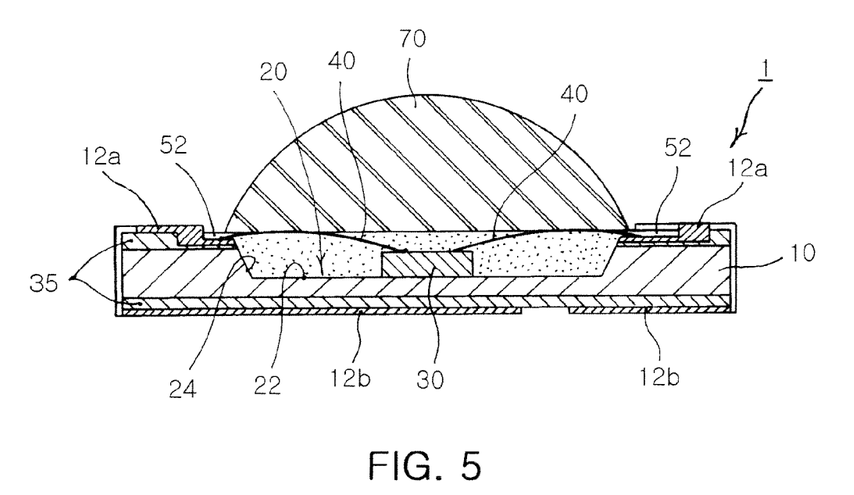
FIG. 5 is a sectional view illustrating the LED package having an anodized insulation layer according to the present invention.

The lens 70 adhered to the substrate 10 as described above is not disposed on the electrode connecting grooves 52 of the substrate 10, as shown in FIG. 5. With the lens 70 not disposed on the electrode connecting grooves 52 as just described, the wires 40 can be placed in the electrode connecting grooves 52 and the lens 70 does not hinder the placement of the wires 40.

A fabrication method of the LED package 1 having an anodized insulation layer according to the present invention entails the following steps.

The method of fabricating the LED package 1 having an anodized insulation layer according to the present invention starts with etching an outer surface of the substrate 10 to form a reflecting region 20.

The reflecting region 20 includes a central reflecting area 22 where the light source 30 is mounted and an inclined reflecting area 24 surrounding the central reflecting area 22. The step of forming a reflecting region 20 includes forming electrode connecting grooves 52 connecting the electrode of the LED with wires 40, and lens assembly grooves 54 allowing convenient setting of the location of the lens 70 and easy fixing of the lens 70, adjacent to the inclined reflecting area 24 of the reflecting region 20.

Both of these electrode connecting grooves 52 and the lens assembly grooves 54 can be formed by etching.

Next, the substrate 10 is anodized to form insulation layer 35. In this case, the substrate 10 is anodized on surfaces thereof except on the surface of the reflecting region 20 to form the insulation layers 35 of $Al_2O_3$ on upper and lower surfaces of the substrate 10.

In particular, the insulation layers 35 are formed in the electrode connecting grooves 52 and the lens assembly grooves 54 so as to ensure electric connection between the patterned electrodes 12a and 12b with the light source 30.

Then, the patterned electrodes 12a and 12b are formed on the substrate 10. The electrodes 12a and 12b are patterned on the substrate 10 in accordance with the type of LED constituting the light source 30, whether it is a horizontal type where the LED has both electrodes connected to the wires 40 from an upper surface thereof or whether it is a vertical type where the LED has an upper electrode connected to the wire from an upper surface thereof and a lower electrode placed at the underside thereof.

After forming the patterned electrodes 12a and 12b as described above, the light source 30 is mounted on the substrate 10 and electrically connected to the patterned electrodes 12a and 12b.

This step is to establish electric connection via the wires 40.

After the electric connection of the light source 30 with the patterned electrodes 12a and 12b, a lens 70 is assembled onto the substrate 10. In this step, a transparent adhesive resin is applied on the reflecting region 20 of the substrate 10 and then the lens 70 is attached to the substrate 10.

In this step, the projections 72 formed on the outer circumferential surface of the lens 70 are aligned with the lens assembly grooves 54 provided in the substrate 10, and the lens 70 is easily attached to the substrate 10 using an adhesive resin.

Figure 6:
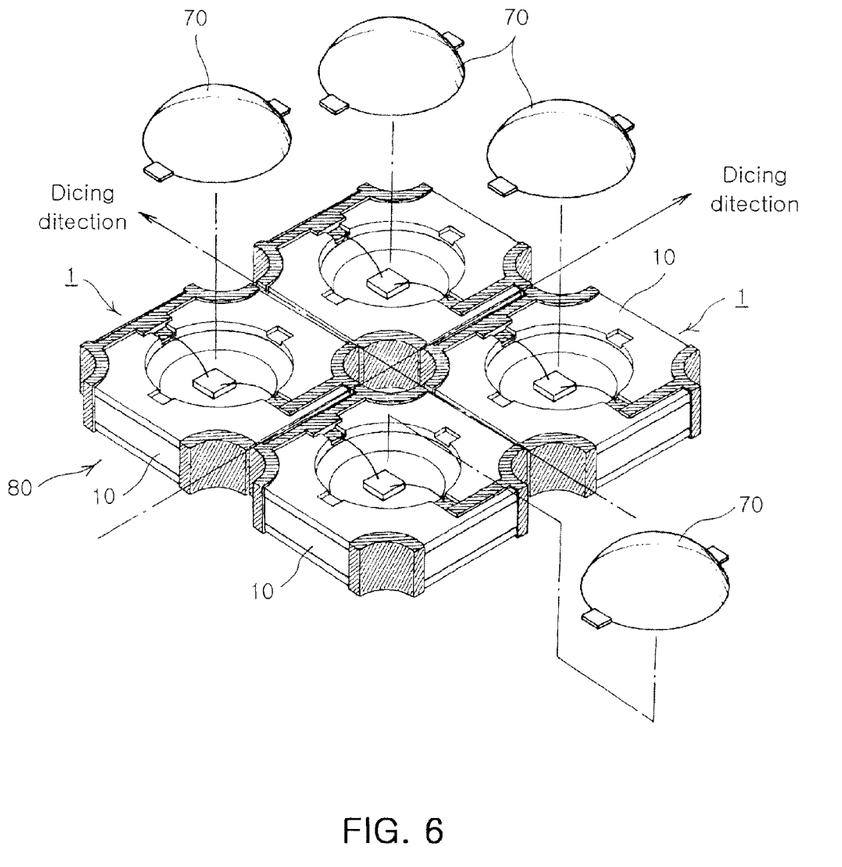
FIG. 6 is a perspective view illustrating the LED package having an anodized insulation layer according to the present invention being separated from a mother substrate.

In the present invention, it is possible to fabricate each of the substrate 10 and the lens 70 separately, but alternatively as shown in FIG. 6, the substrates 10 can be diced from a large mother substrate 80.

That is, after a large mother substrate 80 is divided into a plurality of substrates 10, the above steps are implemented on each of the substrates 10, and then a plurality of lenses 70 are respectively attached to the substrates 10. Then, the substrates 10 with the lenses 70 are diced into individual LED packages 1 according to the present invention.

The process of using such a mother substrate 80 to produce a plurality of LED packages 1 at once is well known in the art, and thus no further explanation is provided.

In the LED package 1 having an anodized insulation layer fabricated through the above described steps according to the present invention, the substrate 10 is made of an Al material. Such an Al substrate 10 has superior heat conductivity, allowing an excellent radiation effect of heat generated during the light emission of the LED.

Moreover, as the reflecting region 20 is formed in the substrate 10 by etching, and the lens 70 is easily attached to the substrate 10, the manufacturing process is simplified to obtain a low cost LED package.

Figure 7:
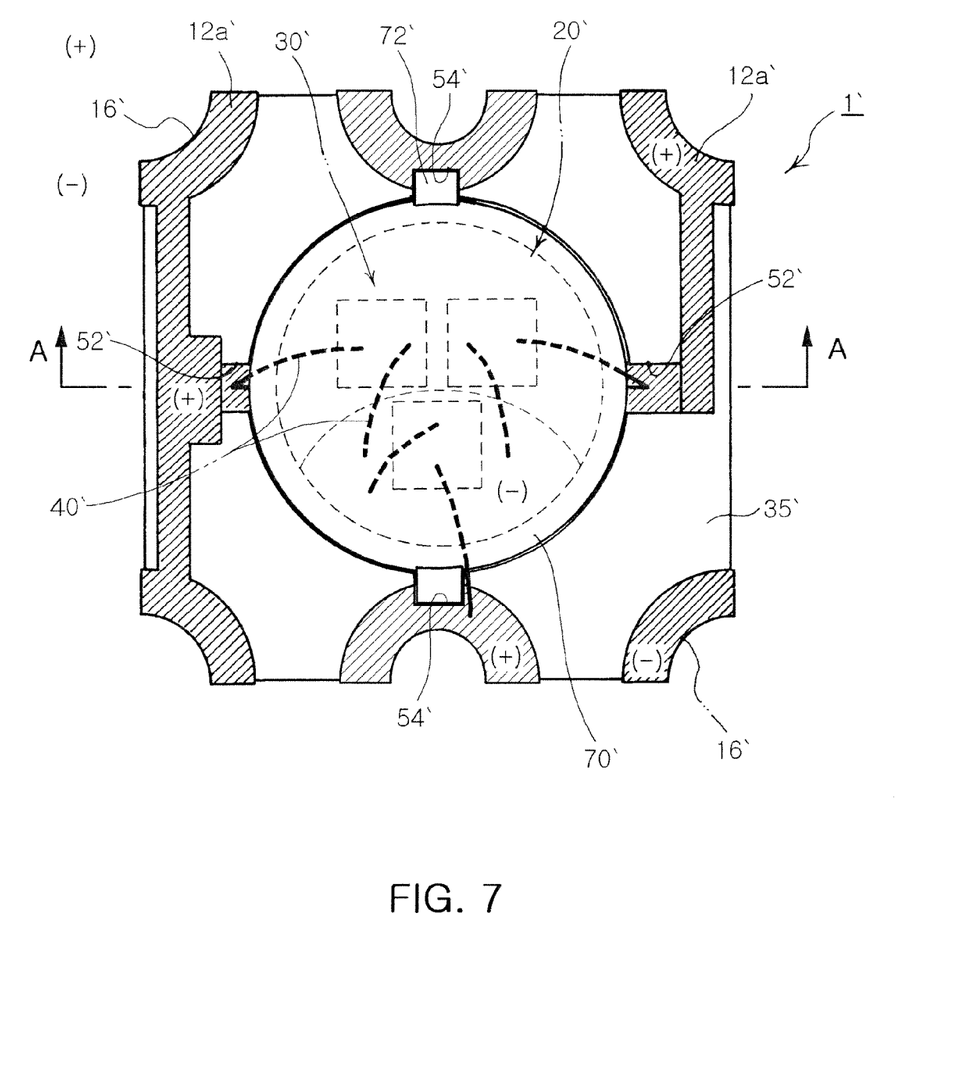
FIG. 7 is a plan view illustrating an LED package having an anodized insulation layer according to another embodiment of the present invention.
Figure 8:
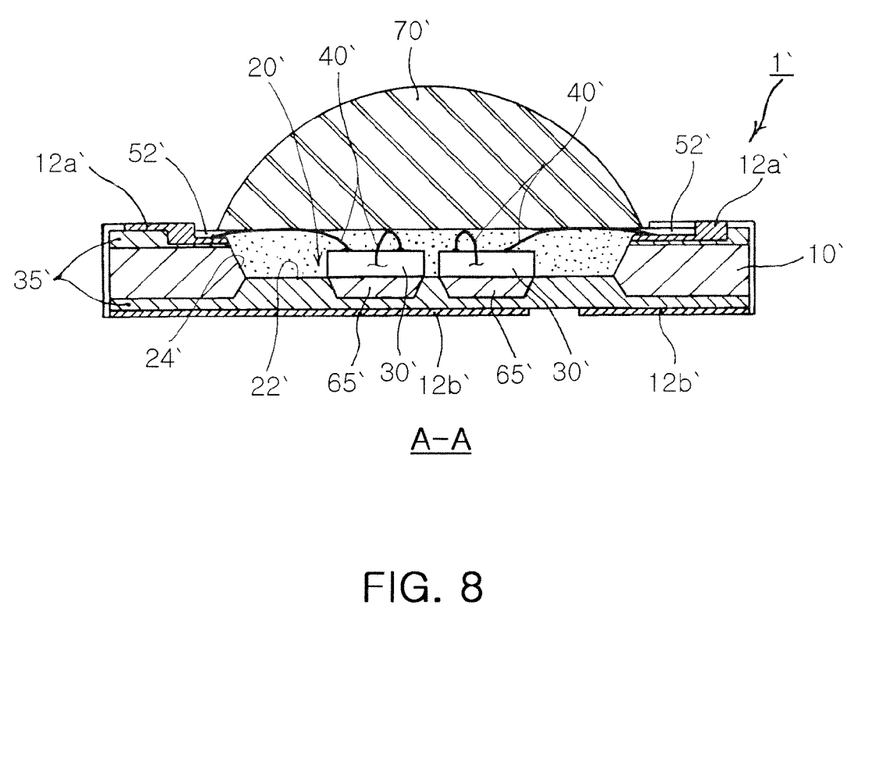
FIG. 8 is a sectional view illustrating the LED package according to another embodiment of the present invention cut along the A-A line of FIG. 7.

FIGS. 7 and 8 illustrate an LED package 1' having an anodized insulation layer according to another embodiment of the present invention.

The LED package 1' employing an anodized insulation layer according to the present invention, shown in FIG. 8, has a configuration and technical concept similar to those of the aforedescribed LED package 1 with reference to FIGS. 2 to 6. Thus, the same reference numerals will be used to designate the same components, with a prime next to each of the numbers.

The LED package 1' employing an anodized insulation layer shown in FIGS. 7 and 8 includes a plurality of LEDs, i.e., blue, red and green LEDs, as a light source 30' to emit white light.

The LEDs are insulated by the anodized insulation layers 35' and electrically connected by wires 40' to positive (+) or negative (−) electric terminals of the patterned electrodes 12a' and 12b'.

In addition, the LED package 1' also includes Al heat radiators 65' serving as heat slugs under the LEDs to allow superior heat radiation effects. The Al heat radiators 65' functioning as the heat slugs are surrounded by the anodized insulation layer 35' to form electric insulation with other parts of the substrate 10'. Made of Al material having superior heat conductivity, the Al heat radiators 65' can achieve excellent heat radiation effects.

Moreover, the LED package 1' also has the insulation layers 35' formed in the electrode connecting grooves 52' and the lens assembly grooves 54' so as to ensure electric connection between the patterned electrodes 12a' and 12b' and the light source 30'.

Figure 9:
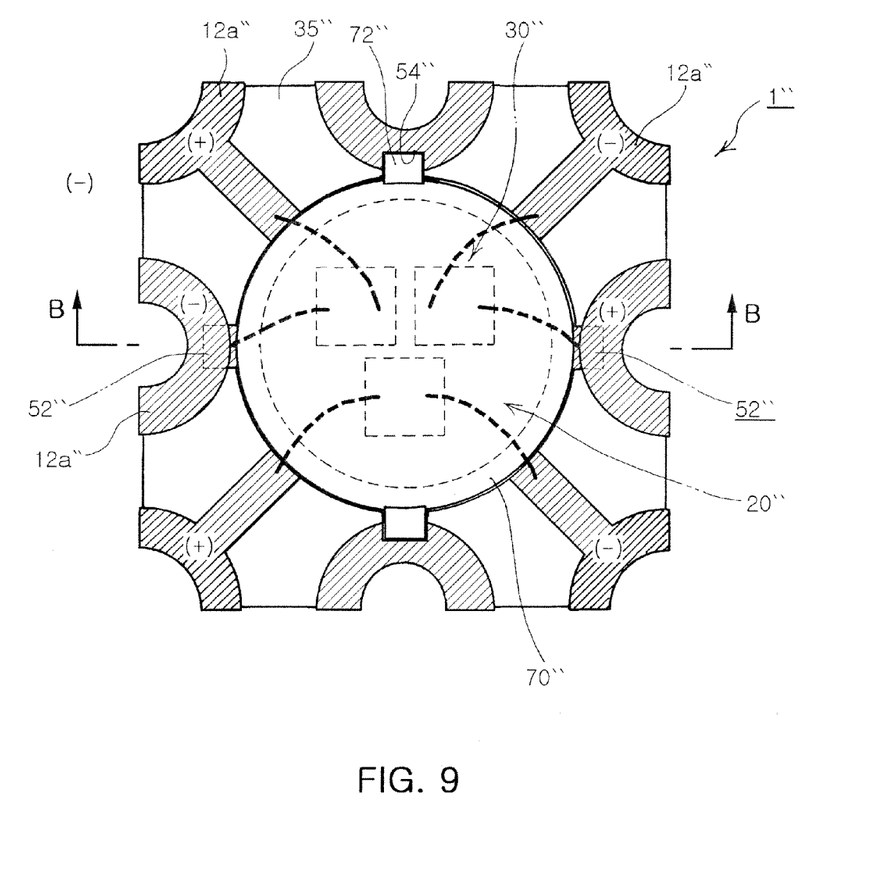
FIG. 9 is a plan view illustrating an LED package having an anodized insulation layer according to further another embodiment of the present invention.
Figure 10:
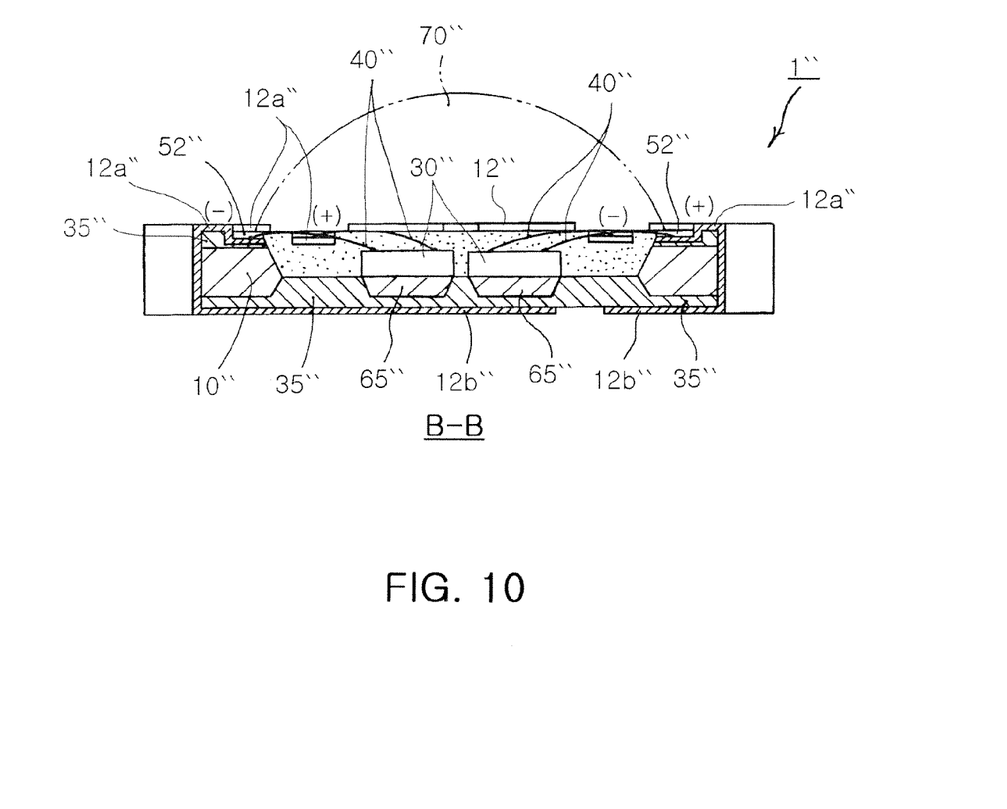
FIG. 10 is a sectional view illustrating the LED package according to further another embodiment of the present invention cut along the line B-B of FIG. 9.

FIGS. 9 and 10 illustrate an LED package 1" having an anodized insulation layer according to further another embodiment of the present invention.

This structure is similar to that of the LED package 1 with reference to FIGS. 2 to 6, and is based on the same technical concept. Thus, the same reference numerals are used to designate the same components, with double primes " next to each of the numbers.

The LED package 1" having an anodized insulation layer according to the present invention, shown in FIGS. 9 and 10, includes a plurality of LEDs, i.e., blue, red and green LEDs to emit white light. The LEDs are insulated by the anodized insulation layers 35" on the substrate 10", and electrically connected by wires 40" to positive or negative electric terminals of the patterned electrodes 12a" and 12b".

The LED package 1" also includes Al heat radiators 65" formed under the plurality of LEDs to obtain superior heat radiation effects. The Al heat radiators 65" functioning as the heat slug parts are made of an Al material of superior heat conductivity, thereby achieving excellent heat radiation effects of the LEDs.

In addition, the LED package 1" also has the insulation layer 35" formed in the electrode connecting grooves 52" and the lens assembly grooves 54" to ensure electric connection between the patterned electrodes 12a" and 12b" with the light source 30".

According to the present invention set forth above, a substrate is made of an Al material to achieve superior heat radiation effect of LED, thereby increasing the lifetime and light emission efficiency of the LED.

Moreover, as a reflecting region is recessed in a substrate, there is no need to bond a separate reflecting member as in the prior art, thereby simplifying the manufacturing process.

Furthermore, a lens has projections thereof assembled into lens assembly grooves provided in the substrate, thereby easily determining the mounting location of the lens. This enables an easy alignment of the lens with the substrate, thereby reducing the manufacturing costs.

While the present invention has been shown and described in connection with the exemplary embodiments, it will be apparent to those skilled in the art that modifications and variations can be made without departing from the spirit and scope of the invention as defined by the appended claims.

What is claimed is:

1. A method for fabricating a light emitting diode package, comprising:

etching a surface of a substrate to form a reflecting region;
anodizing the substrate to form an insulation layer;
forming patterned electrodes on the substrate;
mounting a light source on the substrate and electrically connecting the light source to the patterned electrodes; and
assembling a lens onto the substrate,
wherein the step of etching a surface of a substrate comprises forming electrode connection grooves adjacent to the reflecting region to electrically connect the light source to the patterned electrodes with wires, and forming lens assembly grooves for defining the location of the lens part on the substrate.

2. The method according to claim 1, further comprising dicing a mother substrate into a plurality of the individual substrate.

3. The method according to claim 1, wherein the substrate is anodized on surfaces thereof to form insulation layers, except on surfaces of the reflecting region so as not to hinder the reflection of light from the light source to the outside.

4. The method according to claim 1, further comprising forming an Al heat radiator under the light source.

5. The method according to claim 4, wherein the insulation layer is formed on a lower surface of the substrate, and surrounds the Al heat radiator to form electric insulation with the substrate.

6. The method according to claim 1, wherein the electrode connection grooves have a depth larger than a depth of the lens assembly grooves.

7. The method according to claim 1, wherein the substrate is made of Al.

8. The method according to claim 1, wherein the assembling a lens onto the substrate includes forming projections on an outer surface of the lens and inserting the projections into the lens assembly grooves.

9. The method according to claim 1, wherein the assembling a lens onto the substrate includes adhering the lens to the substrate so as not to dispose the lens on the electrode connection grooves, so that the wires can be placed in the electrode connection grooves and the lens does not hinder the placement of the wires.

* * * * *